United States Patent
Lankhorst et al.

(10) Patent No.: US 7,911,822 B2
(45) Date of Patent: Mar. 22, 2011

(54) INTEGRATED CIRCUIT WITH PHASE-CHANGE MEMORY CELLS AND METHOD FOR ADDRESSING PHASE-CHANGE MEMORY CELLS

(75) Inventors: Martijn H. R. Lankhorst, Eindhoven (NL); Hendrik G. A. Huizing, Neerkant (NL)

(73) Assignee: NXP B.V., Eindhoven (NL)

( * ) Notice: Subject to any disclaimer, the term of this patent is extended or adjusted under 35 U.S.C. 154(b) by 293 days.

(21) Appl. No.: 11/577,708

(22) PCT Filed: Oct. 17, 2005

(86) PCT No.: PCT/IB2005/053399
§ 371 (c)(1),
(2), (4) Date: Apr. 20, 2007

(87) PCT Pub. No.: WO2006/043230
PCT Pub. Date: Apr. 27, 2006

(65) Prior Publication Data
US 2009/0067226 A1 Mar. 12, 2009

(30) Foreign Application Priority Data
Oct. 21, 2004 (EP) .................................. 04105212

(51) Int. Cl.
*G11C 11/00* (2006.01)
*G11C 11/36* (2006.01)
(52) U.S. Cl. .................. 365/148; 365/163; 365/175
(58) Field of Classification Search .............. 365/148, 365/158, 163, 171, 173
See application file for complete search history.

(56) References Cited

U.S. PATENT DOCUMENTS

| | | | | |
|---|---|---|---|---|
| 6,912,146 B2 * | 6/2005 | Gill et al. | ...... | 365/148 |
| 6,982,903 B2 * | 1/2006 | Bertin et al. | ...... | 365/163 |
| 7,042,760 B2 * | 5/2006 | Hwang et al. | ...... | 365/163 |
| 7,110,286 B2 * | 9/2006 | Choi et al. | ...... | 365/163 |
| 7,130,214 B2 * | 10/2006 | Lee | ...... | 365/163 |
| 7,136,299 B2 * | 11/2006 | Chu et al. | ...... | 365/163 |
| 7,180,771 B2 * | 2/2007 | Cho et al. | ...... | 365/163 |
| 7,289,351 B1 * | 10/2007 | Chen et al. | ...... | 365/163 |
| 7,304,885 B2 * | 12/2007 | Cho et al. | ...... | 365/163 |
| 7,304,886 B2 * | 12/2007 | Cho et al. | ...... | 365/163 |
| 7,308,067 B2 * | 12/2007 | Lowrey et al. | ...... | 365/163 |

FOREIGN PATENT DOCUMENTS

| | | |
|---|---|---|
| WO | 00/57498 | 9/2000 |
| WO | 2004/025659 A1 | 3/2004 |
| WO | 2004057618 A2 | 7/2004 |

OTHER PUBLICATIONS

"Writing Current Reduction for High-Density Phase-Change RAM", Hwang Yn et al, International Electron Devices Meeting 2003, IEDM, Technical Digest, Washington DC, Dec. 8-10, 2003.

"Full Intergration and cell characteristics for 64 mb Nonvolatile PRAM", Lee S H et al. VLSI Technology, 2004, Digest of Technical Papers, 2004 Symposium on Honolulu HI USA Jun. 15-17, 2004 Piscataway NJ, IEEE, Jun. 15, 2004.

\* cited by examiner

*Primary Examiner* — Trong Phan

(57) ABSTRACT

The present invention relates to an integrated circuit comprising a plurality of bitlines (b1) and a plurality of word-lines (w1) as well as a plurality of memory-cells (MC) coupled between a separate bit-line/word-line pair of the plurality of bit-lines (b1) and wordlines (w1) for storing data in the memory cell. Each memory cell (MC) comprises a selecting unit (T) and a programmable resistance (R). The value of the phase-change resistance (R) is greater than the value of a first phase-change resistance ($R_{opt}$) defined by a supply voltage ($V_{dd}$) divided by a maximum drive current ($I_m$) through said first phase-change resistor ($R_{opt}$).

7 Claims, 6 Drawing Sheets

INTEGRATED CIRCUIT WITH PHASE-CHANGE MEMORY CELLS AND METHOD FOR ADDRESSING PHASE-CHANGE MEMORY CELLS

The present invention relates to an integrated circuit with memory cells comprising a phase-change programmable resistor as well as a method for accessing memory cells comprising a phase-change programmable resistor.

New semiconductor memory devices which are based on the use of so-called phase-change materials as data storage mechanism, i.e. phase-change memories, may become the non-volatile memories of the next generation. The phase-change memories explore the reversible changes in the crystal structure for example of chalcogenide alloys.

The phase-change memory typically comprises an array of constituent cells wherein each cell has some phase-change material for storing data. By incorporating the chalcogenide alloy into an integrated circuit such a cell may act as fast switching programmable resistor. In particular, such a phase-change memory cell comprises a series arrangement of a resistor composed of phase-change material and some kind of selection means. The phase-change resistor is characterized by a low resistance value in the crystalline state and a high resistance value in the amorphous state. The transition between the two states can be reversibly accomplished by thermal excitement of the cell. This can be done by e.g. electrical dissipation in the cell. The amorphous state has the property that above a certain threshold voltage low ohmic filaments are formed. The resulting resistance of the resistor at programming voltages is relatively low and the same in both amorphous as crystalline state. This resistance value is called dynamic-on resistance, and it is this value that determines the effective electrical response of the resistor to an applied programming voltage pulse, i.e. the term resistance R of the programmable resistor refers to the dynamic on resistance.

The change from the crystalline to the amorphous phase of the phase-change material can be programmed with a short high power pulse, i.e. RESET. The change from amorphous to crystalline state is performed by programming the material with a relative longer and lower power pulse, i.e. SET. For more details on programming a phase-change material memory please refer to WO 2004/025659 A1.

The selection means may be implemented as a diode, bipolar transistor or a (N)MOS-transistor. Regarding embedded applications the usage of a NMOS-transistor in series with the programmable phase-change resistor is the preferable option in terms of the fabrication and because it is the most reliable option for embedded applications.

In a typical memory cell with a programmable phase-change resistance, the source of the (N)MOS-transistor is connected to a reference voltage, preferably to common ground, while the drain is connected in series to the programmable resistor R.

A memory based on an array of NMOS-transistor with programmable resistor according to the prior art is shown in FIG. 9. The drains of the respective transistors are connected via the programmable resistor to the bit-line bl. The gates of the NMOS-transistors are connected to the word-lines wl. The source of the transistor is connected to common ground. Here, an implementation of addressing merely the central cell for a RESET operation by applying $V_{dd}$ to the word-line wl and the bit-line bl for the central cell is shown. All other word lines wl and bit-lines bl are addressed with zero voltage. The RESET operation is considered as it requires the maximum power to be delivered to the programmable resistor. Examples of such a prior art phase-change memory is shown in EP 1326254 and in WO 2004/057618. In EP 1326254 only the voltages at the bit-lines are adjusted to program the cells with different resistance values, while the word-line is merely used for the selection of the respective memory cells.

FIG. 10 shows a side view of a part of a contact cell of a phase-change memory cell according to WO 00/57498. The cell comprises a top electrode TE on the top of a phase-change material PC and a bottom electrode BE as a side wall spacer. The selection means e.g. the (N)MOS transistor is not shown. The width W of the bottom electrode BE is considered the critical dimension in this memory cell, since its value determines both resistance of the resistor as well as the required RESET power.

FIG. 11 shows a top view of a line cell of a phase-change cell according to WO 2004/057618 A2. Here, the memory cell consists of two vias or plugs VP in contact with a phase-change material PC. Between the vias or plugs VP in contact with the phase-change material PC, a connection is provided comprising phase-change material with a smaller cross-section than the contact area of the vias VP with the phase-change material PC. The width W of this connection is also considered as a critical dimension in the memory cell.

The width W of the bottom electrode BE in FIG. 10 as well as the width of the line in the phase-change line cell according to FIG. 11 influences the resistance as well as the required programming power of the programmable resistor. When the width W increases, the required programming power will increase while the resistance of the cell will decrease. Accordingly, if the width W in the cells according to FIGS. 9 and 10 fluctuates, e.g. due to process fluctuations, this will also have a negative effect on the programming of the various memory cells within a memory array.

In WO 2004/025659 a method is described to reduce the effects of the width variations on the required programming time. Here a first pulse of substantially rectangular shape is applied to the memory cell in order to reset the cell. A second pulse of substantially triangular shape is applied to the cell in order to set the cell. The magnitude and the decay rate of the set pulse are selected such that every cell is set.

For a memory cell consisting of a NMOS transistor in series with the programmable resistor, the power load into the resistor, for a certain voltage pulse over the series connection, depends on the resistance value of the resistor relative to the effective resistance of the NMOS transistor. Although the effective resistance of the NMOS transistor depends on source-drain voltage, the ratio between the supply voltage $V_{dd}$ and the maximum drive current $I_m$, i.e. $V_{dd}/I_m$, can be used as a good resistance value to characterize the NMOS transistor. It should be noted that maximum power load is obtained at an optimal resistance value of the programmable resistor, $R_{opt}$, that is approximately equal to the transistor resistance, i.e. $V_{dd}/I_m$. The corresponding power load into the resistor is approximately $0.5 * V_{dd} I_m$.

As the power load of the above-mentioned memory cells is dependent on the resistance of the memory cell, it will accordingly be dependent on the width W of the memory cell. Process fluctuations will result in fluctuations in critical dimension W thus will lead to fluctuations in the power load into each cell of the memory-array. Ideally the used programming voltages are the same for every cell in the array. However, due to the fluctuations in the corresponding power load, the same voltage pulses will lead to different programmed states for cells with different critical dimension W.

It is therefore an object of the invention to provide an integrated circuit with memory cells comprising a phase-change memory resistor as well as a method of addressing memory cells comprising a programmable phase-change resistor for which the required programming voltage pulses are insensitive to fluctuation in the dimensions of the memory cells.

This object is solved by an integrated circuit as well as a method of addressing a memory cell as described herein.

Therefore, an integrated circuit is provided which comprises a plurality of bit-lines and a plurality of word-lines as well as a plurality of memory cells coupled between a separate bit-line/word-line pair of said plurality of bit-lines and the word-lines for storing data in said memory cell. Each memory cell consists of a selecting unit and a programmable phase change resistance. The value of the phase change resistance is greater than the value of a first phase change resistor defined by the supply voltage divided by the maximum drive current. Therefore, with the provision of a value of the programmable phase-change resistance the fluctuations in the required programming power correspond to fluctuations in the cell dimensions such that cell becomes insensitive to fluctuations in the cell dimensions.

According to an aspect of the invention, the value of the programmable phase-change resistor is 1.2 to 2.2 times the value ($R_{opt}$) of the first phase-change resistor. Accordingly, these values for the programmable phase-change resistor the voltage required for a RESET operation are independent of the fluctuations in the critical width as the fluctuations due to the change in the resistance and the fluctuations due to the change in the required power will cancel out.

According to a further aspect of the invention, the resistance of the programmable phase-change resistor corresponds to 1.8 times the value ($R_{opt}$) of the first phase-change resistor, wherein 1.8 corresponds to the optimal value.

The invention also relates to a method for addressing a memory cell within an array of memory cells with bit-lines and word-lines. Each memory cell comprises a selecting unit and a programmable phase-change resistance. The programmable phase-change resistance R is designed such that its resistance value is greater than the value of the phase-change resistance corresponding to optimal power load into the resistor defined by the supply voltage divided by the maximum drive current.

According to a further aspect of the invention, the bit-line voltage as well as the word-line voltage are lowered for a SET operation on the selected memory cell.

It is the basic idea of the invention to design the resistance of the programmable phase-change resistance to a value, which is higher than the value at which an optimal power input, i.e. $V_{dd}/I_m$, can be achieved. With such a programmable phase-change resistance the RESET voltage is independent of fluctuations in the dimensions of the phase-change memory cells. SET operation can be achieved by lowering the bit-line voltage such that SET-voltage is only slightly dependent on fluctuations in the dimensions of the phase-change memory cell. Also, lowering the word-line voltage will result in a strong dependence on the cell dimensions of the memory cell. Adjusting the bit-line voltage and word-line voltage for a SET programming can result in a situation where the SET and the RESET-programming voltages both are independent of the fluctuations of cell dimensions in the programmable phase-change resistance of the memory cell.

These and other aspects of the invention are apparent from and will be elucidated with reference to the embodiments described hereinafter.

Figure 1:
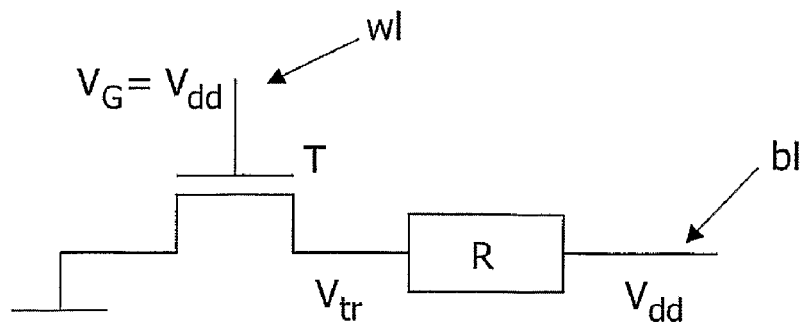
FIG. 1 shows a circuit diagram of a basic phase-change memory cell according to the invention.
Figure 9:
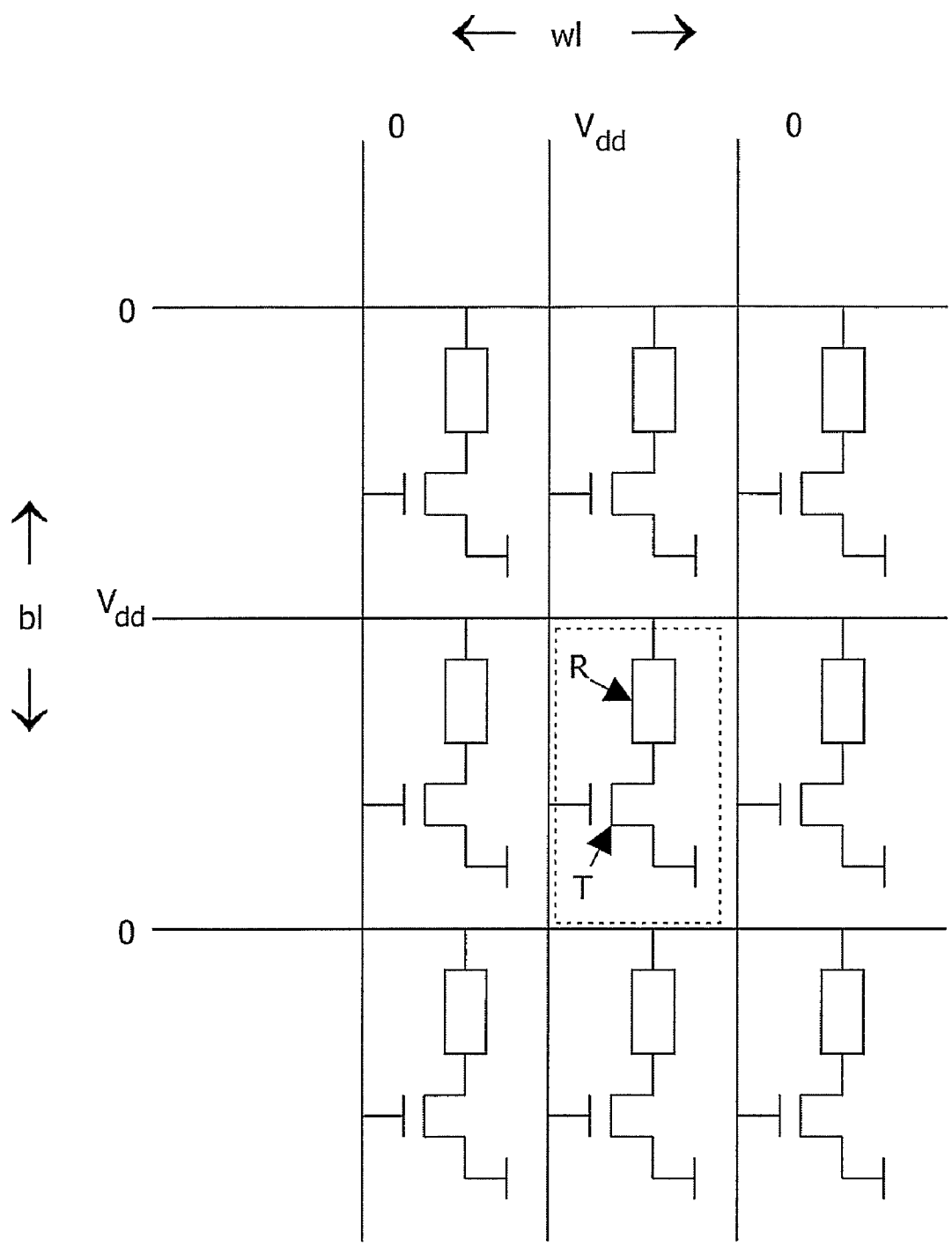
FIG. 9 shows a circuit diagram of an array of phase-change memory cells according to the prior art.
Figure 10:
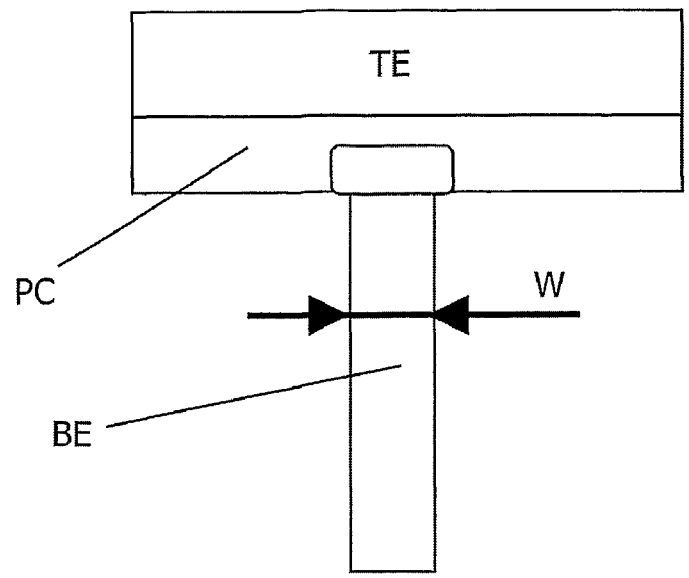
FIG. 10 shows a side view of a part of a prior art phase-change memory cell.

FIG. 1 shows the circuit diagram of a basic phase-change memory cell according to the invention. The memory cell comprises a NMOS transistor T as selecting unit and a programmable phase-change resistance R. The programmable phase-change resistance R is connected to the drain terminal of the NMOS transistor T and is furthermore connected to the bit-line which is supplied with the bit-line voltage. Here, the bit-line voltage is the supply voltage $V_{dd}$ and a maximum drive current $I_m$ can be supplied to the resistor R. The gate of the NMOS transistor T is connected to the word-line wl and is supplied with a gate voltage $V_G$ equal to the supply voltage $V_{dd}$. The source of the NMOS transistor T is connected to a reference potential which can be common ground. The memory cell according to FIG. 1 can be arranged in an array according to FIG. 9.

Figure 2:
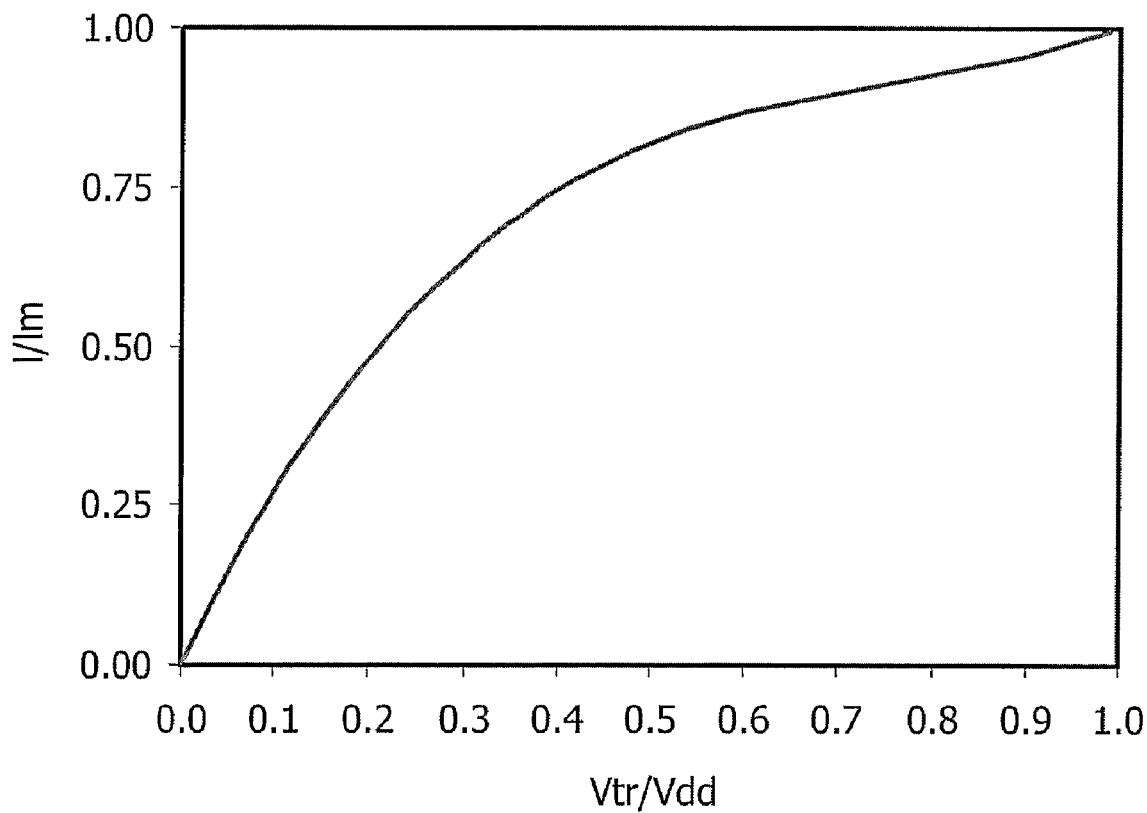
FIG. 2 shows a graph of a simplified model of the NMOS transistor of FIG. 1.

FIG. 2 shows a graph of a simple analytical model of the NMOS transistor of FIG. 1. Here, the normalized drive current ($I/I_m$) for the NMOS transistor T is shown versus the normalized source-drain voltage difference ($V_{tr}/V_{dd}$) for a RESET condition.

If the value of the resistance R is small compared to the supply voltage divided by the maximum drive current $V_{dd}/I_m$, the voltage drop over R will be small as well, since $V=R*I$, and the corresponding power load is less than optimal. If R is large compared to $V_{dd}/I_m$, the voltage drop over R will be high but the voltage drop over the transistor, Vtr, is low. As depicted in FIG. 2, the corresponding drive current $I_m$ of the transistor is low and the resulting power load is again less than optimal. Optimal power load is obtained when the value of the resistor is about the same as $V_{dd}/I_m$.

Figure 3:
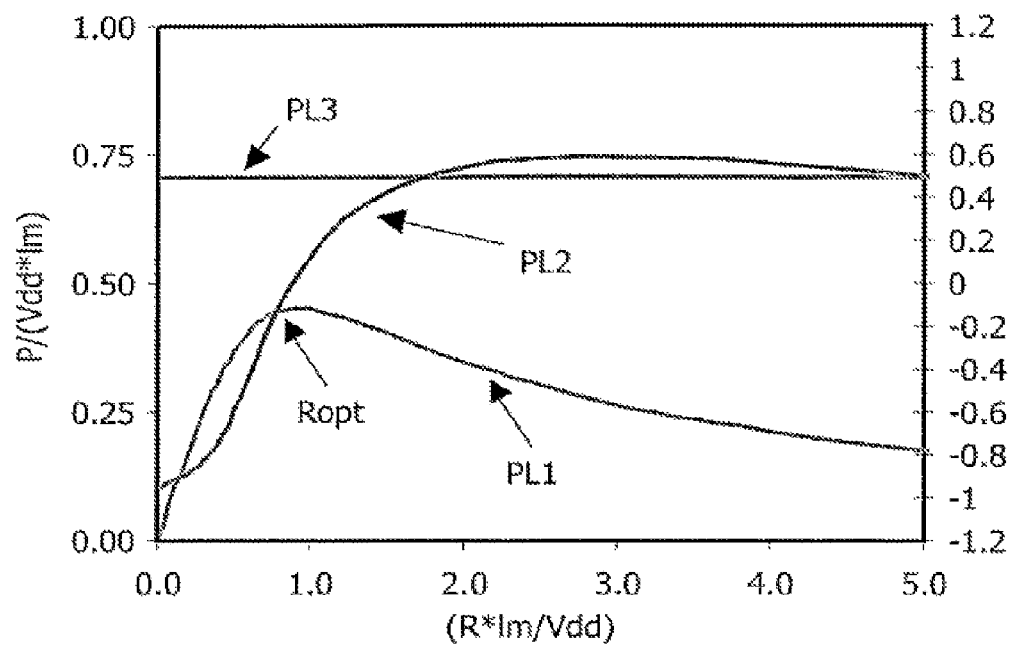
FIG. 3 shows a graph of a model of the memory cell of FIG. 1.

FIG. 3 shows a graph of a model of the memory cell of FIG. 1. The curve PL1 depicts the normalized power load into the resistor $P/(V_{dd}*I_m)$ versus the magnitude of the normalized resistance $R*I_m/V_{dd}$. The curves PL2 and PL3 show the relative power fluctuations due to fluctuations in the line width of the memory cell. The curve PL3 shows changes in the required RESET power due to fluctuations in the line width. Note that these changes are due to thermal considerations. It takes more power to melt a cell with a larger critical dimension W. The curve PL2 depicts the change in the resistance and the associated changes in the power load actually delivered to the resistor. Accordingly, it can be seen that the optimal power load (the maximum of curve PL1), is at $R=0.9*V_{dd}/I_m$. However, at this point the curves PL2 and PL3 do not intersect. If the curves PL2 and PL3 are evaluated, it can be seen that at $R=1.8*V_{dd}/I_m$, the curves do intersect, and the RESET voltage will be independent of the fluctuations of the line width W as the fluctuations in the required RESET power and the fluctuations in the power load will cancel out.

Figure 11:
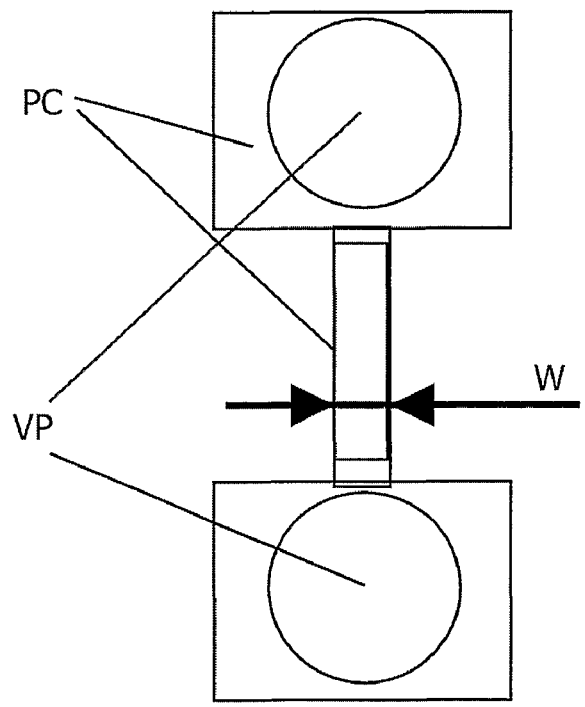
FIG. 11 shows a top view of a part a further prior art phase-change memory cell.

As mentioned above, the resistance of the line cell according to FIG. 11 will be proportional to $W^{-1}$, with W being the line width. Therefore $$\delta R/R = -\delta W/W$$

The required programming power is directly proportional to the magnitude of the critical dimension W. Extensive calculations have made clear that the required programming power exponentially depends on W, as follows $W^n$, where n is in the range 0.33-0.66 Typically n=0.5. Although n=0.5 is used in the above calculations, the principles of invention also hold for other values of n. Then we find:

$$\delta P/P = \frac{1}{2} \delta W/W$$

Figure 4:
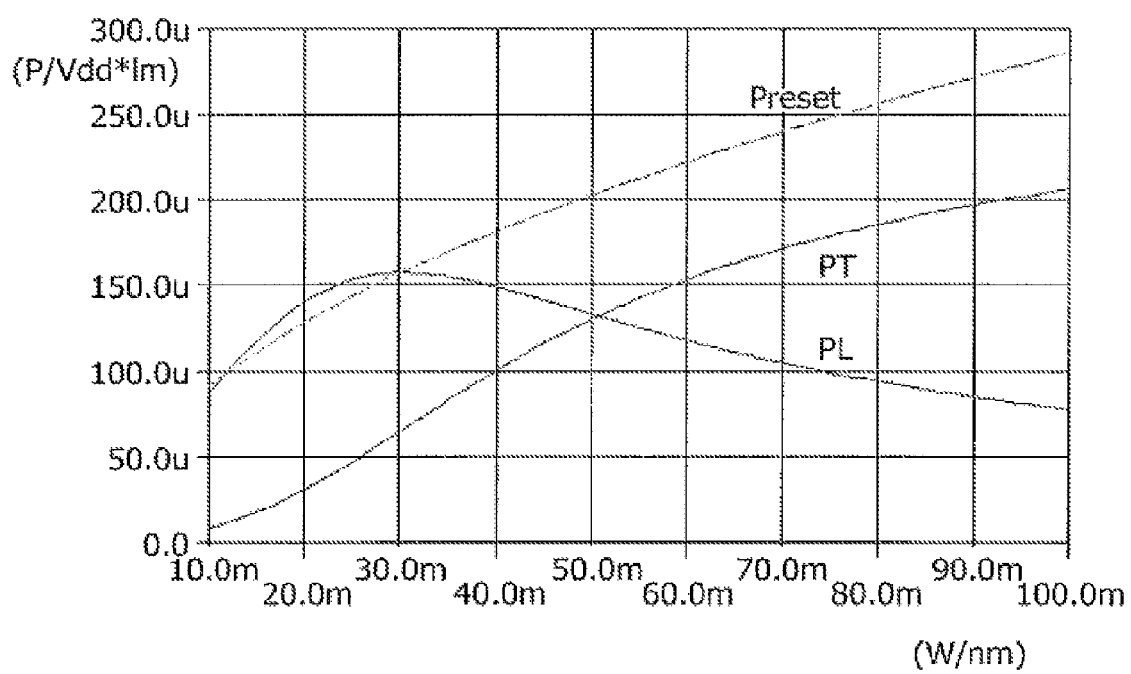
FIG. 4 shows a graph of a model of the memory cell of FIG. 1 for a RESET condition.

FIG. 4 shows a graph of a calculation using a more exact numerical transistor model of the memory cell of FIG. 1 for a RESET condition. The x-axis depicts the line width W in nm, designated as (W/nm). Here, a RESET condition is shown for a supply voltage $V_{dd}$ of 1.2 V and a gate-source voltage $V_{gs}$ of 1.2 V. The width of the NMOS transistor is 500 nm. In this calculation the maximum drive current is 250 µA. In particular, the graph corresponds to a line cell according to FIG. 11, i.e. according to WO 2004/057618. The resistance of the phase-change line is depending on the width W thereof. A width of 30 nm will correspond to 4.6 kOhm. The optimal power input $P_{opt}$ corresponds to a line width of 30 nm and 4.6 kOhm. The latter value is almost the same as $V_{dd}/I_m$=4.8 kOhm. Here, the curve $P_L$ corresponds to the power supplied into the load, the curve $P_T$ corresponds to the power which is dissipated in the transistor T and the curve $P_{RESET}$ corresponds to the power required for the RESET operation.

The optimal power input into the resistance R corresponds to the point where the curve $P_L$ and the curve $P_{RESET}$ cross as here the power required by the resistance will correspond to the actually delivered power. This corresponds to a width W of 30 nm. Here, the power corresponds to 157 µW with a current of 185 µA.

Figure 5:
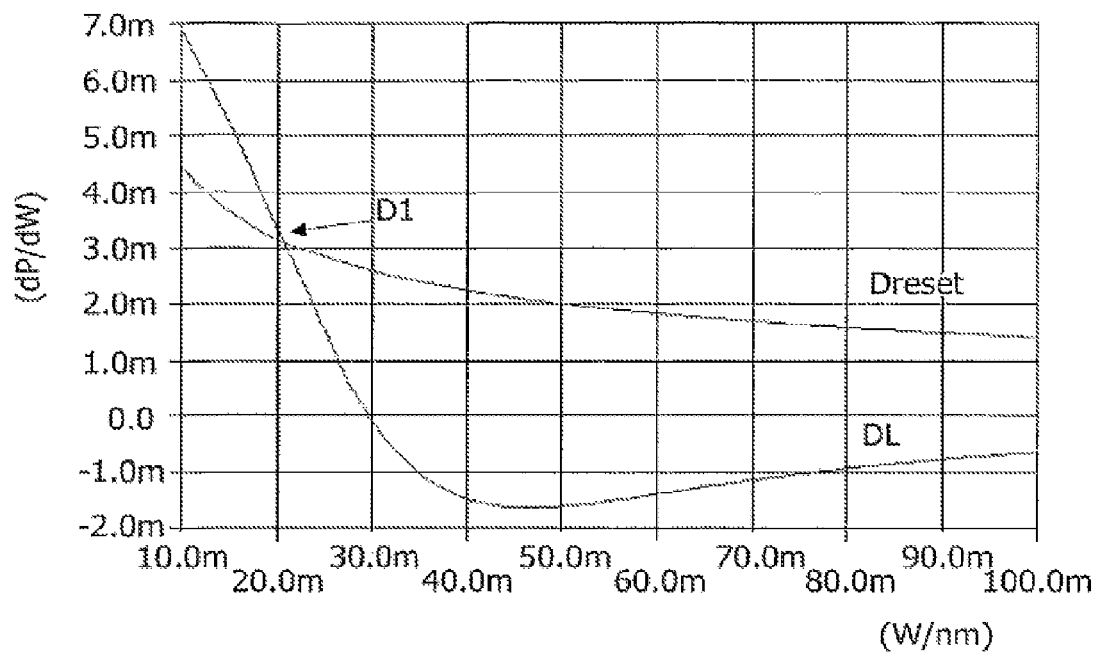
FIG. 5 shows a graph of the derivatives of FIG. 4 for a RESET condition.

FIG. 5 shows a graph of the derivatives dP/dW of the curves $P_{RESET}$ and $P_L$ of FIG. 4 for a RESET condition. The x-axis depicts the line width W in nm. The situation of FIG. 5 corresponds to the situation of FIG. 4. Here, the derivative $D_{RESET}$ of the required RESET power dP/dW and the derivative $D_L$ of the power into the load of FIG. 4, i.e. dP/dW is shown. The two curves $D_{RESET}$ and $D_L$ cross at D1. At this point D1 the derivate of the RESET power $D_{RESET}$ and the derivative of the power into the load $D_L$ correspond to each other. As the derivates relate to the changes of the curves $P_{RESET}$ and $P_L$, in point D1 the changes of the required RESET power and the changes of the power into the load correspond to each other such that the RESET voltage will be independent of the fluctuations of the width of the memory cell. In other words, the changes of the required power for the RESET condition will correspond to the changes of the power into the resistor as in FIG. 4, the resistance of the phase-change line will vary with the line width thereof. A line width of 30 nm will correspond to 4.6 kOhm. At a line width of 21 nm (corresponding to 6.6 kOhm), the point D1 can be found where the fluctuations in the line width have no influence on the RESET conditions, as they comprise the same rate. The corresponding power input will be about 140 µW according to FIG. 4. The resistance value of 6.6 kOhm is about 1.4 times larger than $V_{dd}/I_m$, i.e. 4.8 kOhm.

Figure 6:
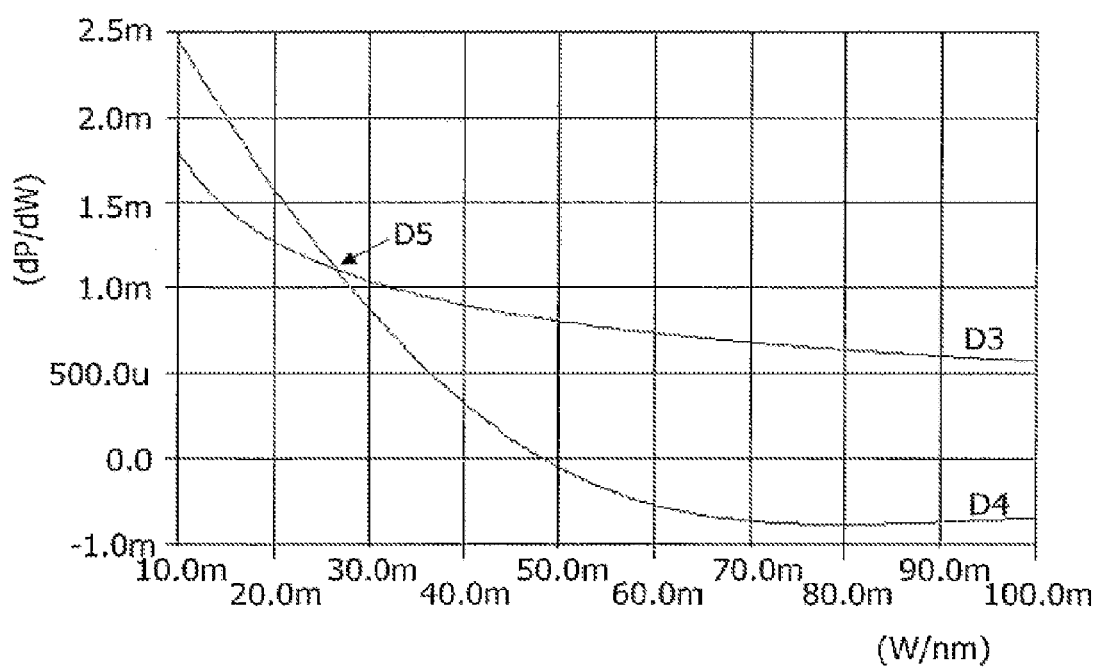
FIG. 6 shows a graph of the derivative for the SET condition.

FIG. 6 shows a graph of the derivative dP/dW for the SET condition. The x-axis depicts the line width W in nm. Here, the SET condition is shown for a supply voltage of 0.705 V and a gate source voltage of 1.2 V. Here, the bit-line voltage is lowered as compared to the cases of FIGS. 4 and 5. The width of the transistor is also selected at 500 nm. The resistance of the phase-change line corresponds to the cases FIGS. 4 and 5, i.e. a line width of 30 nm corresponds to 4.6 kOhm. The curve D3 corresponds to the derivative of the required power for a SET operation, i.e. dP/dW and the curve D4 corresponds to the derivative of the power into the load, dP/dW. These two curves D3 and D4 cross at D5. Accordingly, at D5 the parameters of the SET operation will be independent of the line width fluctuations as D3 and D4 depict the derivates of the required power D3 and the power into the load D4. At a line width of 26 nm (corresponding to 5.3 kOhm), the actual fluctuations in the line width will have no influence on the SET condition. However, this value of 5.3 kOhm (corresponding to a line width of 26 nm) is lower than the resistance for the RESET operation according to FIG. 5 (6.6 kOhm). Therefore, selecting the resistance with a value of 6.6 kOhm, i.e. a line width of 21 nm will result in some fluctuations, although this influence is still smaller than when using the value of 4.6 kOhm at which optimal power load is achieved.

Figure 7:
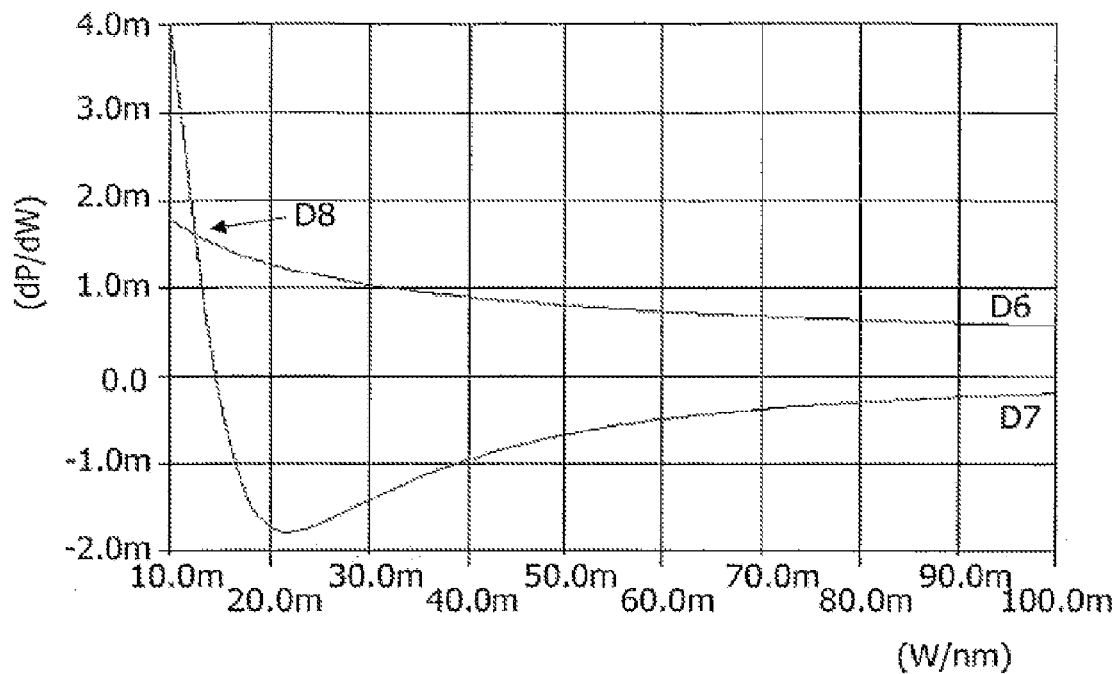
FIG. 7 shows a graph of derivates for the SET condition.

FIG. 7 shows a graph of derivates dP/dW for a further SET condition. The x-axis depicts the line width W in nm. Here, the situation for a SET operation is shown with a supply voltage $V_{dd}$ of a 1.2 V and a gate source voltage Vgs of 0.89 V. Accordingly, here the bit-line voltage is selected as in the case of FIGS. 4 and 5 while the word-line voltage is lower as in those cases. All other conditions, namely the width of the NMOS transistor of 500 nm and the resistance of the phase-change line of 4.6 kOhm at a line width of 30 nm correspond to the cases according to FIGS. 4, 5 and 6. The curve D6 corresponds to the derivative of the required power for a SET operation, i.e. dP/dW and the curve D7 correspond to the derivative of the power into the load, i.e. dP/dW. Those two curves D6, D7 cross at D8. Accordingly, the fluctuations of the required power and the fluctuations of the power into the load will be the same at D8. Therefore the SET voltage will be independent of the fluctuations in the line width W. This situation will occur at a line width of 13 nm corresponding to 10.6 kOhm. The resistance value will be higher than the corresponding value for the RESET operation of 6.6 kOhm. However, at 6.6 kOhm (which is preferably for the RESET condition), i.e. a line width of 21 nm, a strong dependence of the fluctuations in the line width can be seen.

Accordingly, lowering the word-line voltage will result in a strong dependence of the SET parameters with regard to the line width fluctuations.

Figure 8:
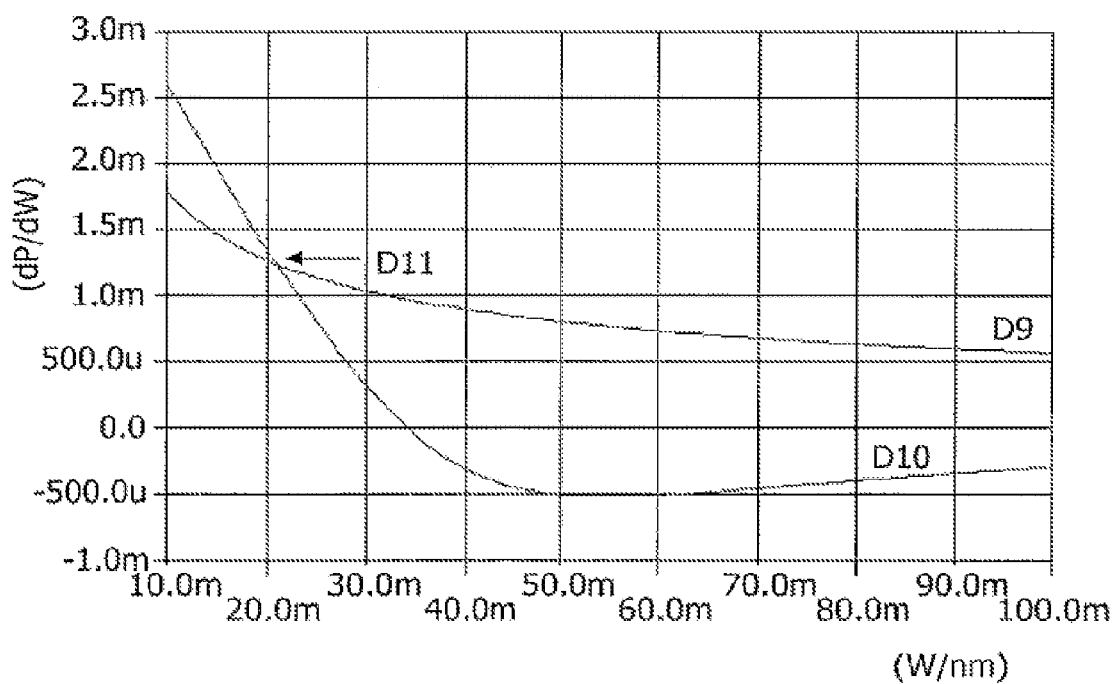
FIG. 8 shows a further graph of the derivates for SET condition.

FIG. 8 shows a further graph of the derivates dP/dW for a further SET condition. The x-axis depicts the line width W in nm. Here, a SET condition is shown with a supply voltage of 0.76 V and a gate source voltage 1.05 V. Accordingly, the bit-line voltage as well as the word-line voltage are both lowered for SET operation. The other parameters correspond to the situations as described according to FIGS. 4, 5, 6 and 7. Here, the curve D9 corresponds to the derivative of the required power for the SET operation, i.e. dP/dW and the curve D10 corresponds to the derivative of the power into the load dP/dW. These two curves D9 and D10 cross at D11. Accordingly, at this point the SET parameters will be independent of the fluctuations in the line width. This point corresponds to a line width of 21 nm, corresponding to 6.6 kOhm. Accordingly, the fluctuations in the line width will have no influence on the SET conditions at a resistance of 6.6 kOhm. Please note that this resistance will correspond to the corresponding value for the RESET condition according to FIG. 5.

Accordingly, if the line width is selected as 21 nm resulting in a resistance of 6.6 kOhm, the RESET value will be independent of the line width fluctuations and if for a SET programming the bit-line voltage as well as the word-line voltage is lower the SET conditions will also be independent of the line width fluctuations.

Summarizing, it can be said that by selecting the value of the phase-change resistor as being larger of the value of the resistor at which an optimal power input can be achieved, i.e.

1.2-2.2 or more preferably 1.3-2.0 with an optimal value of 1.8, the RESET voltage will be independent of the fluctuations in the fluctuations of the cell dimensions of the phase-change memory cell. Under the same condition the bit-line voltage may be lowered to achieve a situation where the SET voltage is only slightly dependent on the fluctuations of the cell dimensions of the phase-change memory cell. Lowering the word-line voltage will however result in a strong dependence on the cell dimensions and is therefore not preferred. However, if the bit-line voltage as well as the word-line voltage are adjusted for the SET condition, a value for the resistance can be found were the SET voltage as well as the RESET programming voltage are independent of fluctuations of the cell dimensions in the phase-change memory cell.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Integrated circuit, comprising:
   a plurality of bit-lines (bl), a plurality of word-lines (wl), and a plurality of memory cells (MC) coupled between a separate bit-line/word-line pair of the plurality of bit-lines (bl) and word-lines (wl) for storing data in a selected memory cell (MC);
   wherein each memory cell (MC) comprises:
      a selecting unit (T) with an effective resistance of $V_{dd}/I_m$, where $V_{dd}$ is a supply voltage of the selected memory cell (MC) applied to each of the bit-lines (bl) and the word-lines (wl), and $I_m$ is a maximum drive current ($I_m$) of the selecting unit (T); and
      a programmable phase-change resistor (R) with a resistance of $R_{pc}$;
      wherein a ratio of the resistance $R_{pc}$ of the phase-change resistor (R) relative to the effective resistance $V_{dd}/I_m$ of the selecting unit (T) is greater than 1, as follows:

$$R_{pc}*I_m/V_{dd}>1,$$

where '*' represents a multiplication operation and '/' represents a division operation.

2. Integrated circuit according to claim 1, wherein said ratio corresponds to about 1.2 to about 2.2.

3. Integrated circuit according to claim 1, wherein the ratio is 1.8.

4. Integrated circuit according to claim 1, wherein a bit-line voltage and a word-line voltage are lowered for a SET operation on the selected memory cell (MC).

5. Method of addressing a selected memory cell (MC) within an array of memory cells (MC) with bit-lines (bl) and word-lines (wl), wherein each memory cell (MC) comprises:
   a selecting unit (T) with an effective resistance of $V_{dd}/I_m$, where $V_{dd}$ is a supply voltage of the selected memory cell (MC) applied to each of the bit-lines (bl) and the word-lines (wl), and $I_m$ is a maximum drive current ($I_m$) of the selecting unit (T); and
   a programmable phase-change resistance (R) with a resistance of $R_{pc}$;
   wherein a ratio of the resistance $R_{pc}$ of the phase-change resistor (R) relative to the effective resistance $V_{dd}/I_m$ of the selecting unit (T) is greater than 1, as follows:

$$R_{pc}*I_m/V_{dd}>1,$$

where '*' represents a multiplication operation and '/' represents a division operation.

6. Method according to claim 5, wherein a bit-line voltage and a word-line voltage are lowered for a SET operation on the selected memory cell (MC).

7. Integrated circuit according to claim 1, wherein said ratio corresponds to about 1.5 to about 2.2.

* * * * *